United States Patent [19]

Kobayashi et al.

[11] Patent Number: 4,540,600

[45] Date of Patent: Sep. 10, 1985

[54] PROCESS FOR PRODUCING A MAGNETIC RECORDING MEDIUM

[75] Inventors: Koji Kobayashi; Kiyoshi Noguchi; Suguru Takayama, all of Tokyo, Japan

[73] Assignee: TDK Corporation, Tokyo, Japan

[21] Appl. No.: 588,890

[22] Filed: Mar. 12, 1984

[30] Foreign Application Priority Data

Mar. 30, 1983 [JP] Japan .................................. 58-54797

[51] Int. Cl.³ .............................................. H01F 10/02
[52] U.S. Cl. .................................... 427/130; 204/38.3; 427/131; 427/132; 427/250
[58] Field of Search ................................ 427/127–132, 427/48; 204/56 R, 38.3

[56] References Cited

U.S. PATENT DOCUMENTS 4,239,835 12/1980 Iijima et al. ....................... 428/62 X
4,350,574 1/1982 McDonald ......................... 204/56 R

*Primary Examiner*—Bernard D. Pianalto
*Attorney, Agent, or Firm*—Oblon, Fisher, Spivak, McClelland & Maier

[57] ABSTRACT

A process for producing a magnetic recording medium which comprises forming on a non-magnetic substrate a magnetic thin layer composed of columnar crystal particles comprising Co, or Co and Ni and/or Cr by vapor/depositing the metal atoms at an angle of incidence of at least 20° relative to the normal line of the principal plane of the substrate, and then forcibly oxidizing the magnetic thin layer by electrochemical treatment to form an oxide layer on the surface of the columnar crystal particles of the magnetic thin layer, and thereby to form a magnetic layer.

4 Claims, No Drawings

PROCESS FOR PRODUCING A MAGNETIC RECORDING MEDIUM

BACKGROUND OF THE INVENTION

1. Field of the Invention

The present invention relates to a process for producing a magnetic recording medium, particularly a magnetic recording medium having a magnetic layer of a continuous thin film type, by a so-called oblique vapor deposition method.

2. Description of the Prior Art

In order to attain compact winding of video and audio recording tapes, there have been active researches to develop a magnetic recording medium having a magnetic layer of a continuous thin film type.

As a magnetic layer for such a continuous thin film type medium, a vapor deposited magnetic layer composed of columnar crystal particles of e.g. Co, Co-Ni, Co-Cr or Co-Ni-Cr is most suitable from a view-point of the desired characteristics, which is formed by a so-called oblique vapor deposition method in which the vapor deposition is conducted at a predetermined inclined angle relative to the normal line of the substrate.

Further, by conducting the vapor deposition while supplying a substantial amount of oxygen to the atmosphere for the oblique vapor deposition, it is possible to cover the surface of the columnar crystal particles with an oxide layer (e.g. Japanese Examined Patent Publication No. 23208/1981), whereby the electromagnetic conversion characteristics as well as the running durability will be improved and thus better results can be expected. However, in the case of a Co-Ni system, if the oxygen supply rate is increased to increase the oxide layer, the coercive force which is an important characteristic for a high density recording medium, tends to decrease while the running durability will be improved. In order to increase the oxygen supply rate and yet to maintain the coercive force at a certain acceptable level, it is necessary to increase the angle of incidence for the oblique vapor deposition, relative to the normal line of the substrate. However, in such a case, the vapor deposition efficiency will sharply drop, and the operation will be uneconomical. Further, the film density will decrease and the corrosion resistance will be poor. Furthermore, there will be problem that due to the oxygen supplied in a great amount, the molten metal in the crucible is likely to be oxidized or a trouble in the vacuum system is likely to be led.

Thus, the recording media prepared by the conventional oblique vapor deposition method, do not fully satisfy the requirements for adequate electromagnetic conversion characteristics, running durability, economy for the production and corrosion resistance.

SUMMARY OF THE INVENTION

Under these circumstances, it is a primary object of the present invention to provide a process for economically producing, by means of an oblique vapor deposition method, a magnetic recording medium having a magnetic layer which has superior running durability and high corrosion resistance as well as good electromagnetic conversion characteristics and good magnetic properties such as the coercive force, the magnetic flux density and the squareness ratio.

Such an object can be accomplished by the following invention.

Namely, the present invention provides a process for producing a magnetic recording medium which comprises forming on a non-magnetic substrate a magnetic thin layer composed of columnar crystal particles comprising Co, or Co and Ni and/or Cr by vapor-depositing the metal atoms at an angle of incidence of at least 20° relative to the normal line of the principal plane of the substrate, and then forcibly oxidizing the magnetic thin layer by electrochemical treatment to form an oxide layer on the surface of the columnar crystal particles of the magnetic thin layer, and thereby to form a magnetic layer.

DETAILED DESCRIPTION OF THE INVENTION

Now, the present invention will described in detail with reference to the preferred embodiments.

In the present invention, firstly a magnetic thin layer having a predetermined composition is formed on a substrate by means of a so-called oblique vapor deposition method.

The magnetic thin layer comprises Co as the main component, and it may further contain Ni and/or Cr, as the case requires.

Namely, the magnetic thin layer may be composed of Co alone or a mixture of Co and Ni. When the magnetic layer contains Ni, the weight ratio of Co/Ni is at least 0.5.

Further, the magnetic thin layer may contain Cr. By the incorporation of Cr, the electromagnetic conversion characteristics, the output and the S/N ratio as well as the strength of the layer will be improved. In such a case, the weight ratio of Cr/Co or Cr/(Co+Nr) is preferably from 0.001 to 0.1, more preferably from 0.005 to 0.05.

Further, such a magnetic thin layer may additionally contain a small amount of other components, particularly transition elements such as Fe, Mn, V, Zr, Nb, Ta, Ti, Zn, Mo, W or Cu.

The magnetic thin layer comprising such components is formed by an oblique vapor deposition method.

In the vapor deposition, the minimum angle of incidence of the vapor deposition substance is 20° relative to normal line of the substrate. If the angle of incidence is less than 20°, it is difficult to obtain desired electromagnetic conversion characteristics.

Other conditions for the vapor deposition are not critical. Namely, the atmosphere for the vapor deposition may be a usual inert atmosphere such as an argon, helium or vacuumed atmosphere, and the pressure may be at a level of from $10^{-5}$ to $10^0$ Pa. Further, conventional conditions may be employed for the vapor deposition distance, the direction of the transportation of the substrate and the arrangement of a mask.

By such an oblique vapor deposition method, a magnetic thin layer composed of columnar crystal particles comprising Co as the main component as mentioned above, will be formed on the substrate. In such a case, the thickness of the magnetic thin layer is usually from 0.05 to 0.5 μm, preferably from 0.07 to 0.3 μm.

The columnar crystal particles usually have a length corresponding to the thickness of the magnetic thin layer, and they are inclined at an angle within a range of from 10° to 70° relative to the normal line of the principal plane of the substrate.

The diameter of each columner crystal particle is usually from 50 to 500 A.

The substrate on which such a magnetic thin layer is formed, is not critical and may be any non-magnetic substrate. However, a flexible substrate, particularly a substrate made of a resin such as polyester or polyimide, is preferred. The thickness of the substrate may vary, but is preferably from 5 to 20 μm.

The RMS value of the height of the surface roughness of the rear surface opposite to the magnetic layer-forming surface of the substrate is preferably at least 0.05 μm, whereby the electromagnetic conversion characteristics will be improved.

Further, various undercoating layers may be provided between the substrate and the magnetic thin layer, as the case requires.

The magnetic thin layer thus formed, is forcibly oxidized by electrochemical treatment, and then subjected to washing and heat-drying operations.

As the electrochemical treatment, there may be mentioned an anodic oxidation method or a method utilizing a potential-pH diagram. The treating temperature is preferably from 10° to 95° C., and the treating time is from 0.1 to 60 minutes.

By the above mentioned process, there will be formed a magnetic layer which comprises Co, or Co and Ni and/or Cr, and further contains O in an atomic ratio of O/(Co or Co+Ni) being preferably from 0.1 to 0.5, and which preferably has a thickness of from 0.05 to 0.5 μm, more preferably from 0.07 to 0.3 μm.

If necessary, there may be formed a various protective top layer on the magnetic layer.

The magnetic recording medium according to the present invention is useful as a medium for video or audio recording.

The medium according to the present invention has good electromagnetic conversion characteristics as well as good magnetic properties such as the coercive force, the magnetic flux density and the squareness ratio. Further, its running friction is small and its running durability is high. In addition, it has good corrosion resistance such as moisture resistance or oxidation resistance.

Furthermore, according to the present invention, the minimum angle of incidence for the vapor deposition can be maintained at a low level, whereby the vapor deposition efficiency is high, thus bringing about an economical advantage.

Now, the present invention will be described in further detail with reference to specific Examples. However, it should be understood that the present invention is by no means restricted to these specific Examples.

EXAMPLE 1

A magnetic thin layer having a thickness 0.2 μm was formed on a polyethyleneterephthalate (PET) film having a thickness of 12 μm by an oblique vapor deposition method with use of an alloy having a weight ratio of Co/Ni being 4. The film was continuously fed with an inclination relative to the crucible so that the angle of incidence of the vapor deposition substance was 40°. The atmosphere was such that $P_{Ar}=2\times 10^{-2}$ Pa.

The magnetic thin layer thus obtained, had a weight ratio of Co/Ni being 4 and was composed of columnar crystal particles fully grown to the thickness of the layer at an angle of about 30° C. relative to the normal line of the principal plane of the substrate and having a short diameter of 100 Å.

Then, an electrode was provided on the metal surface of the sample thus obtained, to make it an anode. The sample was immersed in a 5% chromium solution containing 0.1 g/l of NaCl and 0.2 g/l of $H_2SO_4$, and subjected to oxidation treatment at a current density of 0.3 $A/dm^2$. The temperature of the solution was 40° C. and a stainless steel plate was used as the cathode. After the oxidation treatment, the sample was washed with deionized water and an alcohol and then heat-dried in a drier to obtain Sample A1.

Sample A1 was subjected to an Auger spectroscopic analysis and ESCA to obtain profiles of Co and O concentrations in the direction of the depth, whereby it was found that O was concentrated at the surface portion and less at the interior portion. The signal attributable to O showed a chemical shift. Further, O was found to be present at the surface of the crystal particles in such a form as bound to the metal.

On the other hand, oblique vapor deposition of an alloy of Co/Ni=4 was conducted in an atmosphere of $P_{Ar}=2\times 10^{-2}$ Pa and $P_{O_2}=3\times 10^{-2}$ Pa under the same condition as above to form a magnetic layer having a thickness of 0.2 μm. The sample thus obtained, was designated as Sample A0. From the cross-sectional photograph and the results of the Auger spectroscopic analysis and ESCA, Sample A0 was found to be substantially the same as Sample A1.

The static magnetic properties of these Samples A0 and A1 were measured. The coercive force (Hc), the magnetic flux per 1 $cm^2$ (φm) at Hmax=5,000 Oe and the squareness ratio are shown in Table 1.

Further, the Samples were left to stand at 60° under a relative humidity of 90% for 3 days, whereupon the changes in the magnetic flux per 1 $cm^2$ (Δφm) were measured and the corrosion resistance was evaluated. The results thereby obtained are shown in Table 1.

TABLE 1

| Samples | A1 | A0 |
|---|---|---|
| O/(Co + Ni) (Atomic ratio) | 0.15 | 0.05 |
| Hc (Oe) | 850 | 600 |
| φm (emu/$cm^2$) | $9\times 10^{-3}$ | $8\times 10^{-3}$ |
| Squareness ratio | 0.85 | 0.7 |
| Corrosion resistance Δφm (%) | 2 | 6 |

From the results shown in Table 1, the effect of the present invention is evident.

Further, Sample A1 was confirmed to have a minimum running friction and to be adequately durable for the practical running operation.

EXAMPLE 2

A magnetic thin layer having a thickness of 0.2 μm was formed on PET having a thickness of 12 μm by conducting oblique vapor deposition at an angle of incidence at 45° in an atmosphere of $P_{Ar}=2\times 10^{-2}$ Pa with use of an alloy having a weight ratio of Co/Ni/Cr being 75/20/5. Oxidation treatment was applied in the same mannner as in Example 1, whereby Sample B1 was obtained.

From the cross-sectional photograph and the results of the Auger spectroscopic analysis and ESCA, it was confirmed that the magnetic layer was composed of columnar crystal particles fully grown to the thickness of the layer at an angle of 35° relative to the normal line of the principal plane of the substrate and having a short diameter of 200 Å, and that 0 was present at the surface portion of the particles.

The results are shown in Table 2.

TABLE 2

| Samples | B1 |
| --- | --- |
| O/(Co + Ni) (Atomic ratio) | 0.25 |
| Hc (Oe) | 900 |
| φ m (emu/cm$^2$) | 80 × 10$^{-3}$ |
| Squareness ratio | 0.95 |
| Corrosion resistance Δφ m (%) | 0 |

From the results shown in Table 2, the effect of the present invention is evident.

Further, Sample B1 was confirmed to have a minimum running friction and to be adequately durable for the practical running operation.

What is claimed is:

1. A process for producing a magnetic recording medium which comprises forming on a non-magnetic substrate a magnetic thin layer composed of columnar crystal particles comprising Co, or Co and Ni and/or Cr by vapor-depositing the metal atoms at an angle of incidence of at least 20° C. relative to the normal line of the principal plane of the substrate, and then oxidizing the magnetic thin layer by anodic oxidation to form an oxide layer on the surface of the columnar crystal particles of the magnetic thin layer wherein the atomic ratio of O/(Co or Co+Ni) is from 0.1 to 0.5, and thereby to form a magnetic layer.

2. The process according to claim 1, wherein the magnetic layer contains Ni, and the weight ratio of Co/Ni is at least 1.5.

3. The process according to claim 1, wherein the magnetic layer contains Cr, and the weight ratio of Cr/(Co or Co+Ni) is from 0.001 to 0.1.

4. The process according to claim 1, wherein the magnetic layer has a thickness of from 0.05 to 0.5 μm.

* * * * *